United States Patent [19]

Fukushima

[11] Patent Number: 4,468,856

[45] Date of Patent: Sep. 4, 1984

[54] METHOD FOR FORMING AN OHMIC CONTACT TO A SEMICONDUCTOR SUBSTRATE

[75] Inventor: Toshitaka Fukushima, Yokohama, Japan

[73] Assignee: Fujitsu Limited, Kawasaki, Japan

[21] Appl. No.: 360,660

[22] Filed: Mar. 22, 1982

[30] Foreign Application Priority Data

Mar. 23, 1981 [JP] Japan ................................. 56-42058

[51] Int. Cl.$^3$ ...................... H01L 21/74; H01L 21/76
[52] U.S. Cl. .............................. 29/577 C; 29/576 W; 29/580; 148/188; 357/59
[58] Field of Search ............ 29/576 E, 576 W, 577 C, 29/580; 148/175, 187, 188; 357/49, 59; 156/653, 657, 643

[56] References Cited

U.S. PATENT DOCUMENTS 3,752,715 8/1973 Antipov et al. ............... 29/577 C X Primary Examiner—Brain E. Hearn
Assistant Examiner—Alan E. Schiavelli Attorney, Agent, or Firm—Staas & Halsey

[57] ABSTRACT

In semiconductor devices, the transistors are isolated by means of either a PN junction isolation method or a passive isolation (PI) method. The present invention aims to improve the PI method, which is disadvantageous in that an electrode, electrically connected to the semiconductor substrate, causes a decrease in the integration density of the IC chip. In the present invention, the vacant space outside the element-forming regions is used to form the electrode and the integration density is not decreased due to the formation of the electrode. Since a polycrystalline silicon layer is in a groove formed in the vacant space, ohmic contact between the polycrystalline semiconductor material in the layer and the semiconductor substrate can be achieved while at the same time keeping the diffusion length of the impurities diffused from the polycrystalline silicon layer and the semiconductor substrate, very short. Therefore, upward diffusion of the impurities from the N+-type buried layer can be effectively suppressed to realize a high breakdown voltage of the semiconductor devices.

10 Claims, 12 Drawing Figures

METHOD FOR FORMING AN OHMIC CONTACT TO A SEMICONDUCTOR SUBSTRATE

BACKGROUND OF THE INVENTION

The present invention relates to a semiconductor device and a method for producing a semiconductor device by means of the passive isolation method, hereinafter referred to as the PI method. More particularly, the present invention relates to an improved means of forming an electrode which is electrically connected to the substrate of the semiconductor device. This electrode is hereinafter referred to as the substrate electrode.

Art prior to the present invention is explained with reference to FIGS. 1A, 1B, 2A, 2B, and 2C.

The isolation method used in the case of bipolar ICs is either a PN junction isolation method illustrated in FIG. 1A or a PI method illustrated in FIG. 1B. The latter method of isolation is superior to the former method of isolation because the elements of the bipolar ICs can be formed having a high integration density. More specifically, in the PN junction isolation method FIG. 1A, an N-type epitaxial layer 2 having a thickness of approximately 3 microns is formed on the P type silicon semiconductor substrate 1. The elements of the bipolar ICs, the transistor elements for example, are then formed on the N type epitaxial layer 2. Only one region in which one of the transistors is formed is shown in FIG. 1A and is denoted by the numeral 3. This region is hereinafter simply referred to as the element-forming region 3. In order to isolate each element-forming region 3 from the other element-forming regions (not shown), a P+-type isolation region 4 is formed in the N-type epitaxial layer 2 by means of thermal diffusion of the P-type impurities. Since the P-type impurities diffuse laterally into the N-type epitaxial layer in a larger area than the area required in the PI method, dimension tolerance $L_1$ and $L_2$, such that the P+-type isolation region 4 is in contact with neither the P-type base region 5 nor the N+-type collector contact region 6, must be provided before thermal diffusion is performed, and therefore the integration density is disadvantageously low. However, a high integration density can be achieved in the bipolar IC illustrated in FIG. 1B by means of the PI method because contact between the P-type base region 5 or the N+-type collector contact region 6 and the isolation region 7 does not result in disadvantages at all due to the fact that the isolation region 7 is an insulator. The isolation region 7 consists of a silicon dioxide film or an insulating material. As is apparent from a comparison of FIG. 1B and FIG. 1A, the element-forming region 3 in FIG. 1B is smaller than that in FIG. 1A, and the N-type epitaxial layer 2 can be used effectively for forming the elements of the bipolar ICs. Nevertheless, the formation of the substrate electrode by means of the PI method involves a problem. Referring again to FIG. 1A, since the P+-type isolation region 4 is electrically connected to the P-type silicon semiconductor substrate 1, the formation of the substrate electrode can be simply achieved by depositing the electrode material on the surface of the P+-type isolation region 4. In other words, the region 4 can be used not only as a PN junction isolation region but also as a means of electrically connecting the P-type electrode material and the silicon semiconductor substrate 1. However, in the case of the PI method the isolation region 7 cannot be used as a means of electrically connecting the electrode material and the silicon semiconductor substrate because the isolation region 7 is insulative.

The reference numerals 8 and 9 in FIGS. 1A and 1B indicate the emitter region and the N+-type buried layer, respectively.

In an attempt to solve the problem involved in the PI method, the semiconductor devices shown in FIGS. 2A, 2B, and 2C have been produced. However, the problem has not been completely solved.

Referring to FIG. 2A, an IC chip 11, in which the bipolar ICs are fabricated, is mounted on a package 10 made of ceramics or the like. The IC chip 11 is thermally bonded to a thin gold layer 12 which is formed by placing a gold pellet (not shown) on the bottom of the recess of the package 10 and then frictionally rubbing the chip over the gold pellet, which is, in turn, flattened and applied to the bottom. The thin gold layer 12 makes possible the easy formation of the substrate electrode. A terminal chip 13 made of metal or silicon is thermally bonded to the thin gold layer 12 and then a wire 15 is strung between the terminal chip 13 and the lead terminal 14, with the result that a path of current or an electric lead is formed between the lead terminal 14 and the silicon semiconductor substrate (not shown) via the bottom surface of the IC chip 11. This process does not involve a complicated bonding operation. However, the construction of and production process of an electronic device are complicated since the terminal chip 13 is indispensible, that is, a path of current cannot be formed by means of the IC chip 11 itself. In addition, in a case where the integration of the bipolar ICs of the IC chip becomes large, the dimension of the IC chip 11 is accordingly so large that no space is left for positioning the terminal chip 13. Instead of forming a thin gold layer 12 by means of a gold pellet, the layer 12 is deposited on the package 10 beforehand, which however, is expensive. Furthermore, the thin gold layer 12 may extend from the bottom of the recess of the package 10 to the top, but this is also expensive.

Referring to FIG. 2B, the substrate electrode is formed on the top surface of the IC chip. The isolation method carried out in the device shown in FIG. 2B is a method of isolation using oxide and poly-silicon and is referred to as the IOP (Isolation by Oxide and Poly-Silicon) method. In the IOP method, a V groove (V-ATE) 20 is formed by subjecting the (100) surface of the silicon semiconductor substrate 1 to anisotropic etching. The impurities having the same conductivity type as that of the silicon semiconductor substrate, i.e. P-type in FIG. 2B, are shallowly introduced into the V-ATE 20 from the surface of the V-ATE 20, thereby forming a P-type diffusion layer 21. Insulating material, such as polycrystalline silicon, is embedded in the V-ATE 20 (the embedded insulating material is not shown in FIG. 2B). The formation of the substrate electrode can be achieved by depositing aluminum 22 on the surface of the N-type epitaxial layer 2 in such a manner that the aluminum 22 is in ohmic contact with the P-type diffusion layer 21. In the IOP method, the V-ATE 20, in which the insulating material is embedded, protrudes into and through the N type epitaxial layer 2 and forms an isolation region. In other words, isolation of the element-forming region 3 from the other element-forming regions is complete even if the P-type diffusion layer 21 is not formed around the V-ATE 20. However, if the P-type diffusion layer 21 is formed around the V-ATE 20, a PN junction isolation region is formed between the N-type epitaxial layer 2 and the P-type diffusion layer 21, and the advantages of the PI method are lost. Therefore, a dimension tolerance, as is necessary in the case of the PN junction isolation method, is also necessary in the case of the IOP method. An advantage of the PI method basically resides in the self-alignment of the base and/or emitter regions, the advantage is lost, however, in the case of the formation of the P-type diffusion layer 21.

Referring to FIG. 2C, the structure of the device formed according to the PI method as shown in FIG. 1B is unchanged, and, in addition to this structure, a P+-type diffusion layer 23, which is so deep that it penetrates through the N-type epitaxial layer 2 into the P-type silicon semiconductor substrate 1, is formed in such a manner that it surrounds the element-forming region 3 and the isolation region 7. The P+-type diffusion layer 23 is used to form the substrate electrode because when a diffusion layer is used there is no decrease in the integration density since the P+-type diffusion layer 23 is formed in a vacant space, i.e. in the part of the N-type epitaxial layer 2 which is located between the neighbouring isolation regions (one of which is shown as "7"). Part of the vacant space in which the P+-type diffusion layer 23 is formed is not part of the element-forming region 3. In order to form the P+-type diffusion layer 23, a heat treatment of approximately 1000° C. is carried out. The heat treatment results in upward diffusion of the N-type impurities of the N+-type buried layer 9. The effective thickness of the N-type epitaxial layer 2 is decreased during the heat treatment to such an extent that the diffusion of P-type impurities in the formation of the P-type base region 5 at a later stage is likely to result in contact or near contact between the N+-type buried layer 9 and the P-type base region 5. Thus, the breakdown voltage of the device is decreased.

SUMMARY OF THE INVENTION

It is an object of the present invention to prevent, in the case of the PI method, upward diffusion of the impurities of a buried layer, to maintain one of the advantages of the PI method, i.e. self-alignment, and to form a substrate electrode on the top surface of an IC chip.

In accordance with the objects of the present invention, there is provided a semiconductor device having
a semiconductor substrate of a first conductivity type,
a semiconductor layer of a second conductivity type opposite the first conductivity type being formed on the semiconductor substrate the first and,
a plurality of isolation regions surrounding a semiconductor element.

The device also comprises at least one groove formed in the semiconductor layer outside the isolation regions. A semiconductor material is filled in at least one groove and contains impurities of the first conductivity type, and an electrode material is formed on the semiconductive layer and electrically connected to the semiconductor substrate due to the diffusion of the impurities from the semiconductor material.

In accordance with the objects of the present invention, there is provided a method for producing a semiconductor device comprising the steps of
forming on a semiconductor substrate having a first conductivity type, a semiconductor layer which is thin and has a second conductivity type opposite the first conductivity type and, isolating the element-forming regions of the semiconductor layer from each other by means of passive isolation regions, each passive isolation region surrounding each of the element-forming region. The said process also comprises the steps of
forming at least one groove in the semiconductor layer at the periphery of the passive isolation regions and filling at least one groove with a semiconductor material containing impurities having the first conductivity type. A heat treatment is carried out to create an ohmic contact between the semiconductor material and the semiconductor substrate; and depositing an electrode material on the semiconductor layer within the at least one groove.

DESCRIPTION OF THE PREFERRED EMBODIMENTS

The embodiments of the present invention are explained with reference to FIGS. 3 through 6.

Figure 3:
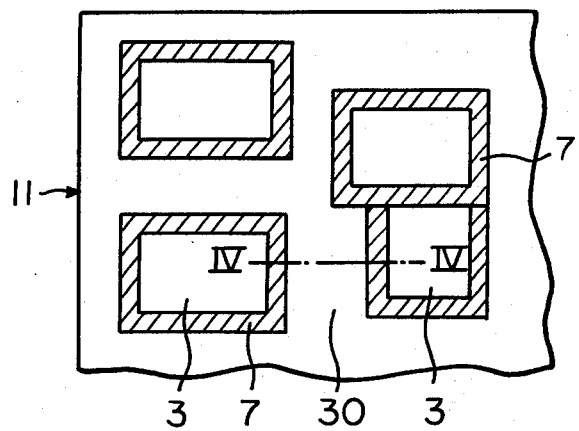
FIG. 3 is a partial plan view of a semiconductor device in which the PI method according to an embodiment of the present invention is employed.

Referring to FIG. 3, a partial plan view of a semiconductor device, which may be an IC chip or LSI chip, is shown. The description hereinafter refers to an IC chip. The passive isolation regions, which are hereinafter referred to as the isolation regions, are denoted in FIG. 3 by the reference numeral 7. As is apparent from FIG. 3, the entire surface of the IC chip 11 is not used for the element-forming regions 3, and therefore a vacant space 30 remains between the isolation regions 7. The substrate electrode or electrodes are formed, according to the present invention, in the semiconductor layer (not shown in FIG. 3), which is formed on the semiconductor substrate (now shown in FIG. 3) and which coincides with the vacant space 30.

Figure 4A:
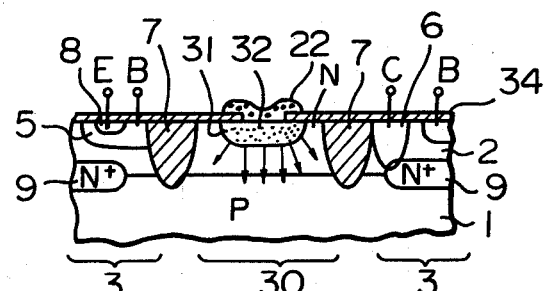
FIGS. 4A, 4B and 4C are partial cross sectional views of a semiconductor device in which the PI method, according to a second, third and fourth embodiment of the present invention, is employed.
Figure 4B:
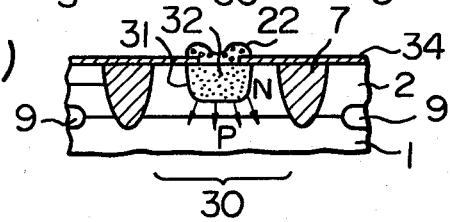
Figure 4C:
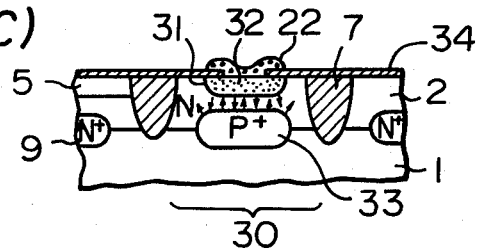

Referring to FIGS. 4A through C, cross sectional views of a semiconductor device, i.e. the IC chip 11, are shown. In the figures, the semiconductor substrate having a first conductivity type is the P-type silicon semiconductor substrate 1, and the semiconductor layer having the second conductivity type is the N-type epitaxial layer 2. The members denoted by the reference numerals 8 and 9 are the same as those in FIG. 1B. A groove 31 is formed in the N-type epitaxial layer 2 at the vacant space 30 by means of etching. A semiconductor material, polycrystalline silicon for example, which is doped with P-type impurities, e.g. boron, is deposited in the groove 31, and then a heat treatment is carried out to create an ohmic contact between the polycrystalline silicon layer 32 and the P-type silicon semiconductor substrate 1. During the heat treatment, the P-type impurities diffuse from the groove 31 as indicated by the arrows. The etching of the (100) surface of the N-type epitaxial layer 2 is carried out to form the groove 31, may or may not be an anisotropic etching or may be a wet etching or dry etching, such as plasma etching. The groove 31 shown in FIG. 4A has a depth of from one third to one fourth the thickness of the N-type epitaxial layer 2. The electrode 22, made of aluminum for example, is deposited on the surface of the polycrystalline silicon layer 32.

Referring to FIG. 4B, a heat treatment is also carried out to create an ohmic contact between the polycrystalline silicon layer 32 and the P-type silicon semiconductor substrate 1. In this case, however, the depth of the groove 31 is half or more than half of the thickness of the N-type epitaxial layer 2 and greater than that in the case of FIG. 4A. In the case of FIG. 4B, the heat treatment mentioned above can be carried out at the same time as the formation of the P-type base region 5 (not shown in FIG. 4B but shown in FIG. 4A). In other words, when thermal diffusion is carried out to form the P-type base region 5, an ohmic contact between the polycrystalline silicon layer 32 and the P-type silicon semiconductor substrate 1 can simultaneously be realized.

Although it is not shown in the drawings, the groove 31 may penetrate into the P-type silicon semiconductor substrate 1. The heat treatment mentioned above is also necessary to create the ohmic contact mentioned above.

The deeper the groove 31 is, the shorter is the diffusion length of the P-type impurities diffused from the polycrystalline silicon layer 32 so that the diffusion of the impurities from the N+-type buried layer 9, for example, is lessened. The depth of the groove 31 should be at least one fourth, preferably one half and more preferably the thickness of the N-type epitaxial layer 2, for lessening the diffusion of the impurities from the N+-type buried layer 9. When, however, the groove 31 is deep, the width or diameter of the groove 31 is, accordingly, large. The depth of the groove 31 may be equal to or greater than the thickness of the N-type epitaxial layer 2.

The depth of the groove 31 should be determined so that the vacant space 30 can be effectively used to achieve a high integration density and so that the diffusion length of the impurities can be lessened as much as possible.

In an embodiment of the present invention, the diffusion length of the impurities diffused from the semiconductor material within at least one groove is lessened. In the embodiment, a buried layer having a first conductivity type is formed and the at least one groove is formed above the buried layer. More specifically, referring to FIG. 4C, a P+-type buried layer 33 is formed and then the heat treatment is carried out so that an ohmic contact between the polycrystalline silicon layer 32 and the P-type silicon semiconductor substrate 1 is created. In this case, the P-type impurities from the P+-type buried layer 33 are diffused in an upward direction and the P-type impurities from the polycrystalline silicon layer 32 are diffused in a downward direction to form the ohmic contact mentioned above. The P-type impurities of the P+-type buried layer 32 for example, antimony, have a high diffusion coefficient.

It is advisable that the creation of the ohmic contact and the thermal diffusion for forming the P-type base region 5 be simultaneously carried out.

Figure 5:
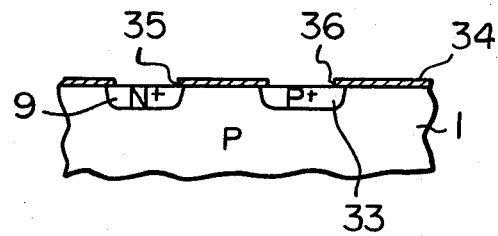
FIG. 5 is a step in the production of the semiconductor device shown in FIG. 4C.

The method for forming an N+-type buried layer 9 and a P+-type buried layer 33 is apparent from the device in FIG. 5. The surface of the P-type silicon semiconductor substrate 1 is cleaned and a silicon dioxide film 34 is then formed on the surface. Subsequently, a window 35 is selectively formed through the silicon dioxide film 34 and N-type impurities are thermally diffused through the window 35 to form the N+-type buried layer 9. The window 35 is then closed with a silicon dioxide film (not shown). A window 36 is then selectively formed through the silicon dioxide film 34, and P-type impurities are thermally diffused through the window 36 to form the P+-type buried layer 33.

The N+-type buried layer 9 and the P+-type buried layer 33 can also be formed by means of the ion implantation method as explained below. The windows 35 and 36 are selectively formed through the silicon dioxide film 34 and a photoresist film (not shown) is applied to the silicon dioxide film 34 to cover the windows 35 and 36. The photoresist film is subjected to exposure and developing, thereby exposing the P-type silicon semiconductor substrate 1 through the window 35. Ion implantation of N-type impurities is then carried out so that the impurities are selectively implanted in the P-type silicon semiconductor substrate 1 through the window 35. The application, exposure, and then development of another photoresist is applied to the silicon dioxide film 34 to form the window 36, through which the P-type impurities are implanted.

The N+-type buried layer 9 and the P+-type buried layer 33 can also be formed by means of an ion beam method in which the parts of the P-type silicon semiconductor substrate 1, exposed through the windows 35 and 36, respectively, are irradiated with N-type and P-type impurities, respectively. The ion beam method is easier to apply than is the ion implantation method in that selective irradiation of the P-type silicon semiconductor substrate 1 with different types of impurity is possible.

After the thermal diffusion method, ion implantation method, or ion beam method is carried out, the N-type epitaxial layer (not shown in FIG. 5) is formed on the P-type silicon semiconductor substrate 1 by means of a well-known epitaxial growth method.

In the embodiments explained above, the groove 31 is formed by means of conventional etching, i.e. isotropic etching, which does not have a preferential etching rate of a specific crystal plane of the semiconductor material. Therefore, the groove 31 usually has a U-shape.

Figure 6A:
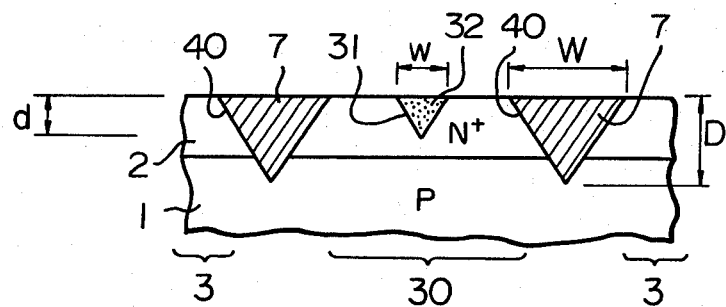
FIGS. 6A and 6B are cross sectional views of a semiconductor device using the method of the present invention, in which the anisotropic wet etching method and dry etching method are, respectively employed.

FIG. 6A is an embodiment of the present invention in which the at least one groove is formed by means of anisotropic wet etching of the (100) plane of the semiconductor substrate.

An advantage of this embodiment is that the at least one groove for forming the substrate electrode and grooves for forming the isolation regions can be simultaneously formed. Another advantage is that since the relative etching rate in the vertical direction, as compared with that in the lateral direction, is high in the case of anisotropic etching, a deep groove can be formed while at the same time keeping the width of the groove small and the diffusion length of the impurities diffused from the semiconductor material filled in the groove very short. As a result, a high integration density can be achieved. The reference numeral 40 indicates two grooves for forming the isolation region 7 (passive isolation region) while the reference numeral 31 indicates one groove for forming the substrate electrode. These grooves 31 and 40 have a depth D or d which is 0.7 times the width W or w of the grooves according to preferential etching the (111) plane of a single silicon crystal. The depth of the groove 31 is determined in light of the diffusion length and the dimension of the vacant space as described with reference to FIGS. 4A and 4B. On the other hand, the depth of the grooves 40 is determined so that the grooves 40 penetrate through the N-type epitaxial layer 2, which usually has a thickness in the range of 3 to 4 microns. Although the depth of the grooves 31 and 40 may be different, the grooves 31 and 40 can be easily formed simultaneously simply by adjusting the width of the grooves, i.e. the width of the windows of the insulating film (not shown in FIG. 6). The heat treatment is carried out to form an ohmic contact between the polycrystalline silicon layer 32 and the P-type silicon semiconductor substrate 1 and the deposition of an electrode material on the polycrystalline silicon layer 32 is carried out as described hereinabove. The surface of the polycrystalline silicon layer 32 should be flattened to prevent the aluminum conductors (not shown) formed on the N-type epitaxial layer 2 from being uneven.

Figure 6B:
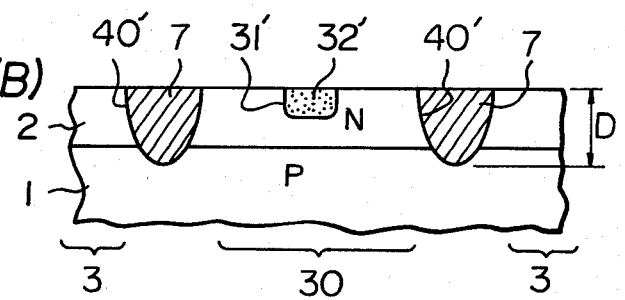

FIG. 6B is an embodiment of the present invention in which at least one groove 40' is formed by means of dry etching, such as plasma etching.

Although the present invention is described hereinabove in regard to a P-type silicon semiconductor substrate 1, it is quite evident that the substrate 1 can have an N-type conductivity within the scope of the appended claims.

I claim:

1. A method for producing a semiconductor device having a semiconductor substrate of a first conductivity type, comprising the steps of:
   (a) forming a semiconductor layer having a first depth and having a second conductivity type opposite the first conductivity type on the semiconductor substrate;
   (b) forming element forming regions in the semiconductor layer;
   (c) isolating the element-forming regions from each other by means of passive isolation regions, each passive isolation region having first and second sides, and surrounding each of the element-forming regions;
   (d) forming at least one groove in the semiconductor layer adjacent to the first side of the passive isolation regions;
   (e) filling the at least one groove with a semiconductor material comprising impurities and having the first conductivity type;
   (f) carrying out a heat treatment to create an ohmic contact between the semiconductor material and the semiconductor substrate; and
   (g) depositing an electrode material on the at least one groove.

2. A method according to claim 1, wherein said step (d) comprises forming the at least one groove using a dry etching process.

3. A method according to claim 1, wherein said step (d) comprises forming the at least one groove using a wet etching process.

4. A method according to claim 1, wherein said step (d) comprises forming the at least one groove having a second depth shallower than the first depth of the semiconductor layer.

5. A method according to claim 4, wherein said step (d) comprises forming the at least one groove having the second depth at least one fourth the first depth of the semiconductor layer.

6. A method according to claim 4, wherein step (d) comprises forming the at least one groove having the second depth at least one half the first depth of the semiconductor layer.

7. A method according to claim 1, wherein said step (d) comprises forming the at least one groove having a second depth equal to the first depth of the semiconductor layer.

8. A method according to claim 1 or 2, wherein said step (d) comprises forming the at least one groove deeper than the semiconductor layer.

9. A method according to claim 2 or 3, wherein said steps (c) and (d) of forming the passive isolation regions and the at least one groove, respectively, are simultaneously performed.

10. A method according to claim 1, further comprising a step of forming a buried layer having the first conductivity type in the semiconductor layer and extending into the semiconductor substrate, and wherein said step (d) of forming the at least one groove positions the at least one groove above the buried layer.

* * * * *

UNITED STATES PATENT AND TRADEMARK OFFICE
CERTIFICATE OF CORRECTION

PATENT NO. : 4,468,856

DATED : SEPTEMBER 4, 1984

INVENTOR(S) : TOSHITAKA FUKUSHIMA

Figure 1A:
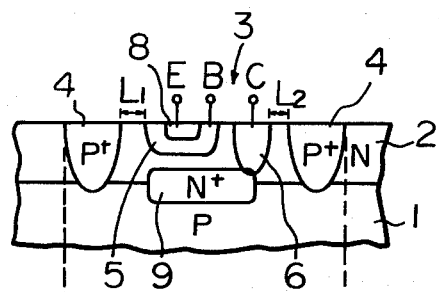
FIG. 1A is a bipolar IC in which a PN junction isolation method is employed.
Figure 1B:
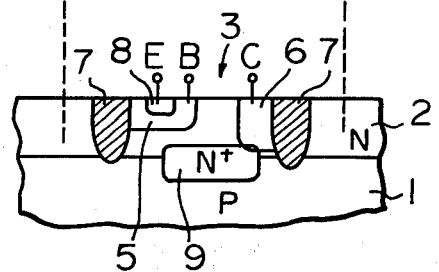
FIG. 1B is a bipolar IC in which a conventional PI method is employed.
Figure 2A:
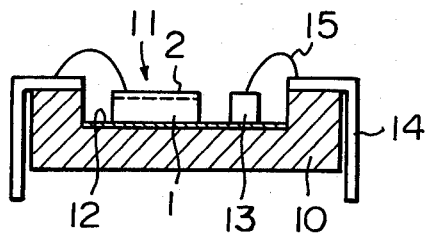
FIGS. 2A, 2B and 2C are semiconductor devices in which isolation is carried out by means of the PI method.
Figures 2B, 2C:
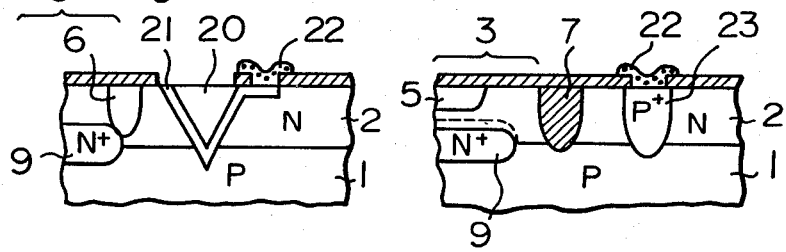

It is certified that error appears in the above-identified patent and that said Letters Patent is hereby corrected as shown below:

Col. 1, line 24, delete "FIG. 1A".

Col. 3, line 60, "tive" should be --tor--.

Col. 4, line 4, "region" should be --regions--.

Signed and Sealed this

Nineteenth Day of March 1985

[SEAL]

Attest:

DONALD J. QUIGG

Attesting Officer     Acting Commissioner of Patents and Trademarks